United States Patent [19]
Genov

[11] Patent Number: 6,085,670
[45] Date of Patent: Jul. 11, 2000

[54] TILTABLE Z-AXIS PLATFORM BASED ON UNI-DIRECTIONAL TILT PLATFORM

[75] Inventor: Genco Genov, deceased, late of San Jose, Calif., by Mila Genov, legal representative

[73] Assignee: Genmark Automation, Inc., Sunnyvale, Calif.

[21] Appl. No.: 09/072,708

[22] Filed: May 5, 1998

[51] Int. Cl.[7] .................................................. A47B 9/00
[52] U.S. Cl. ........................ 108/147; 108/20; 108/144.11; 248/188.4
[58] Field of Search ........................ 108/7, 147, 144.11, 108/147.19, 4, 6, 8, 20; 74/89.15, 424.8 R, 479.01; 248/188.4, 405

[56] References Cited

U.S. PATENT DOCUMENTS

| | | | |
|---|---|---|---|
| 4,602,555 | 7/1986 | Bushey | 108/20 X |
| 5,794,541 | 8/1998 | Hirose | 108/6 X |

*Primary Examiner*—Peter M. Cuomo
*Assistant Examiner*—Karlena D. Schwing
*Attorney, Agent, or Firm*—Burns Doane Swecker & Mathis L.L.P.

[57] ABSTRACT

A uni-directional tilt mechanism for supporting a robotic arm mechanism or other structures includes a simplified system of two motors for tilting a support platform in one dimension. The uni-directional tilt platforms according to the invention may be stacked to provide a universally tiltable stacked platform system for supporting a robotic arm mechanism. The multi-directional tilt stacked platform system can be used to align a Z-axis of a transferred substrate with cassettes or workstations in which substrate is to be placed by the robot.

51 Claims, 11 Drawing Sheets

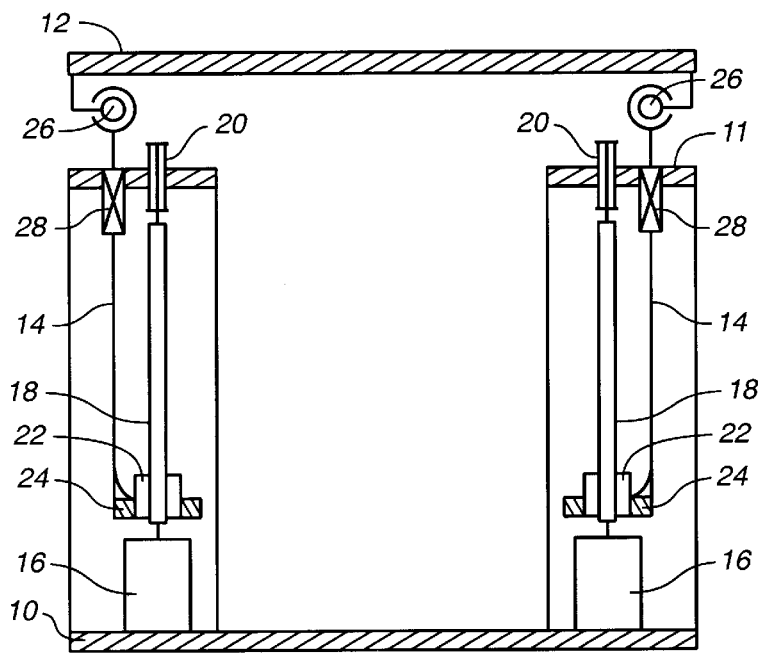
FIG._1
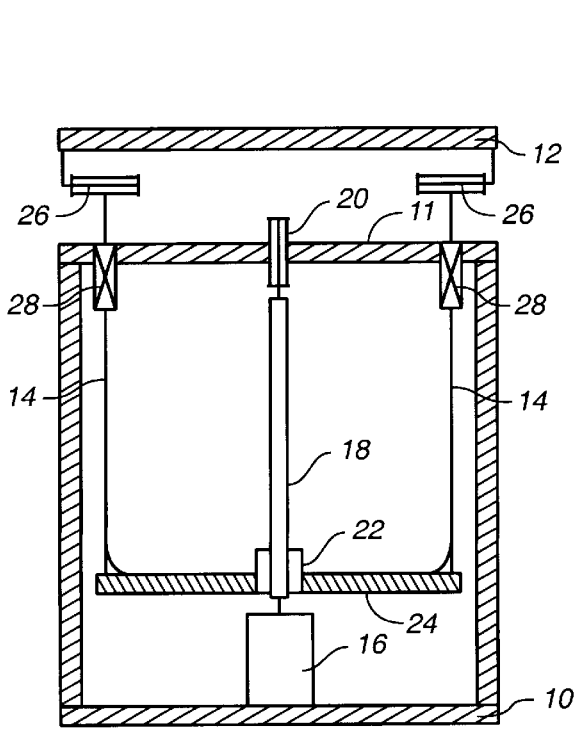
FIG._2
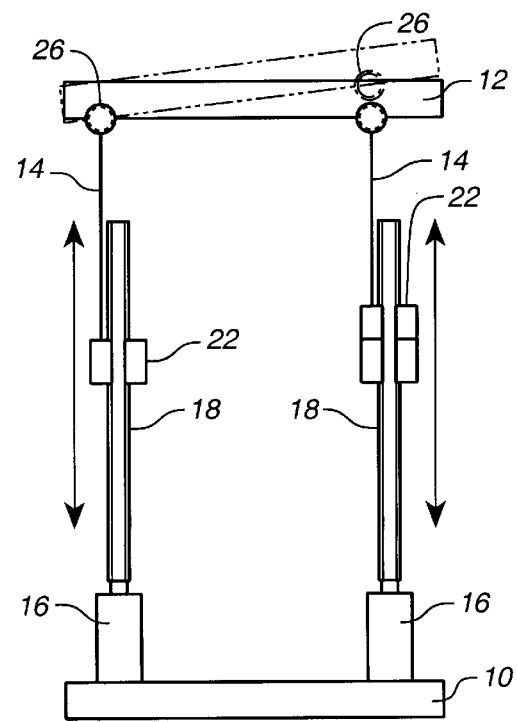
FIG._3

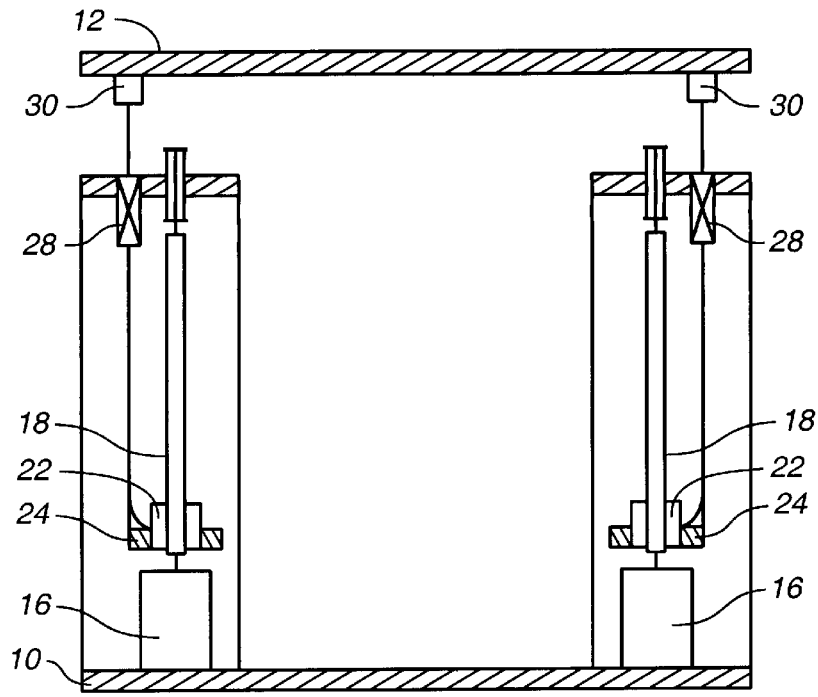
FIG._4
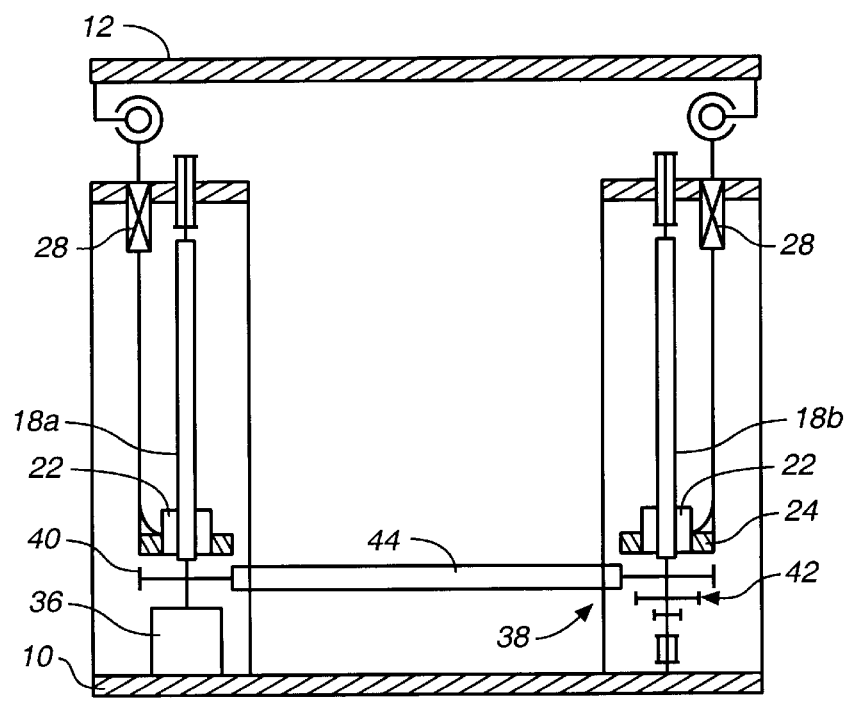
FIG._5

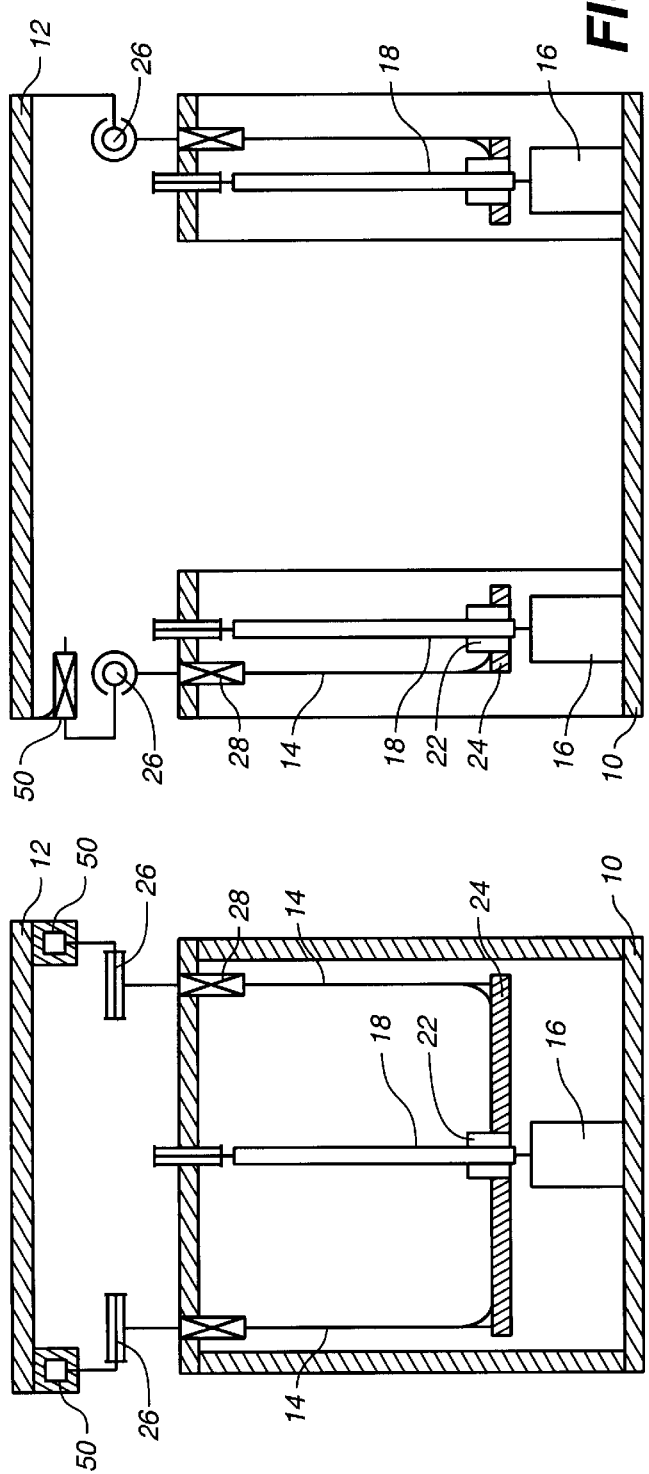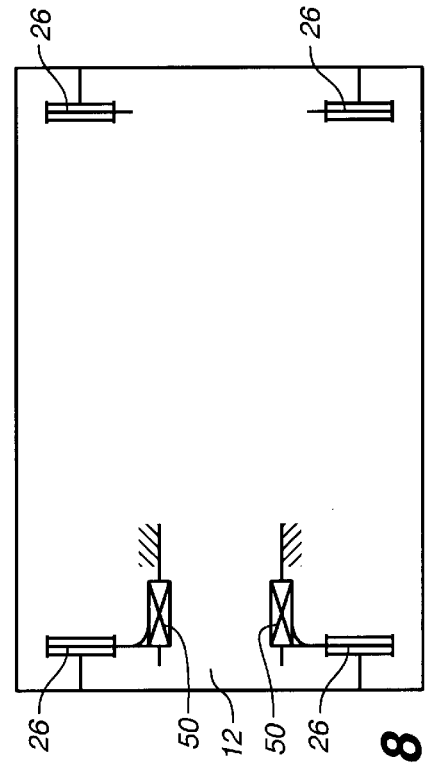

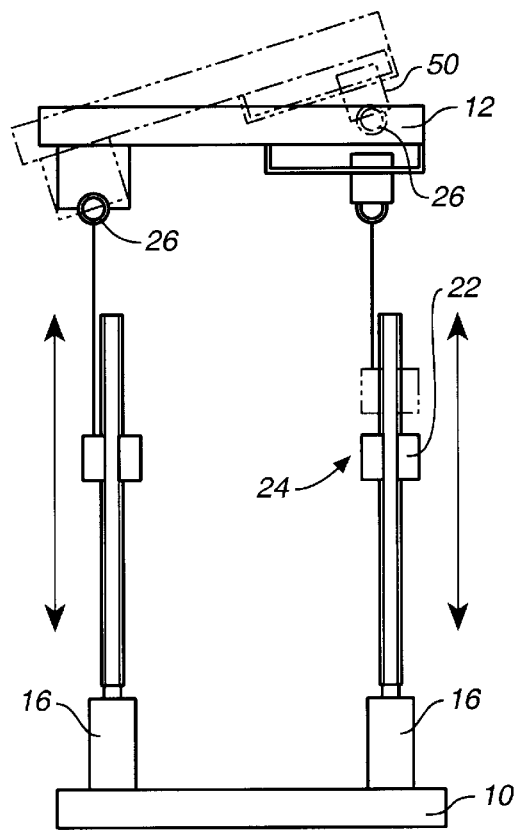
FIG._9
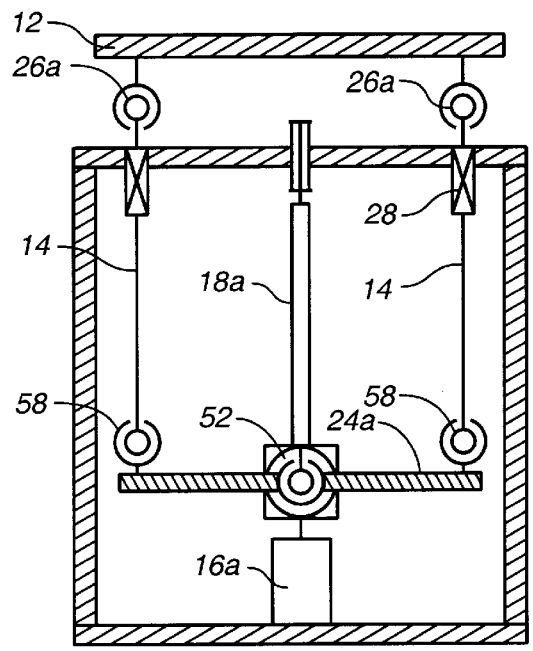
FIG._10
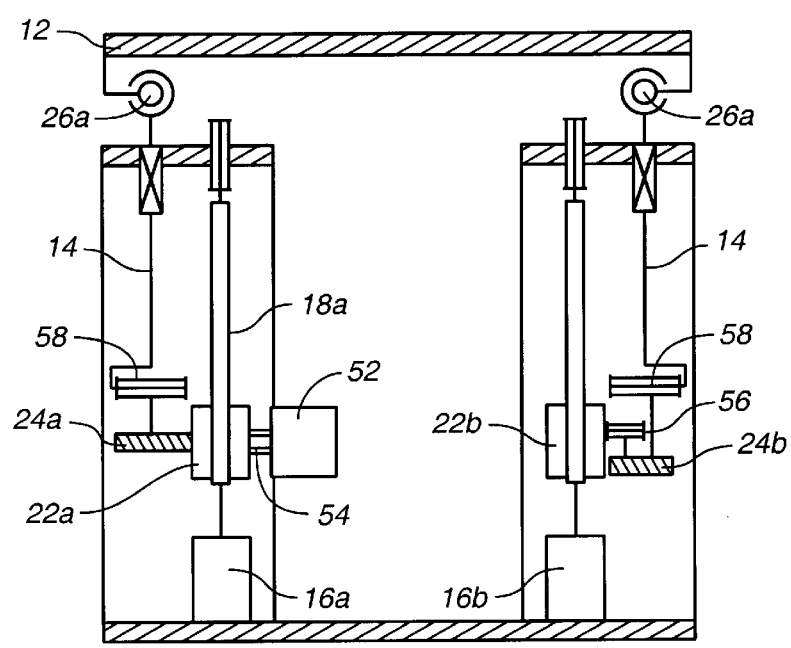
FIG._11

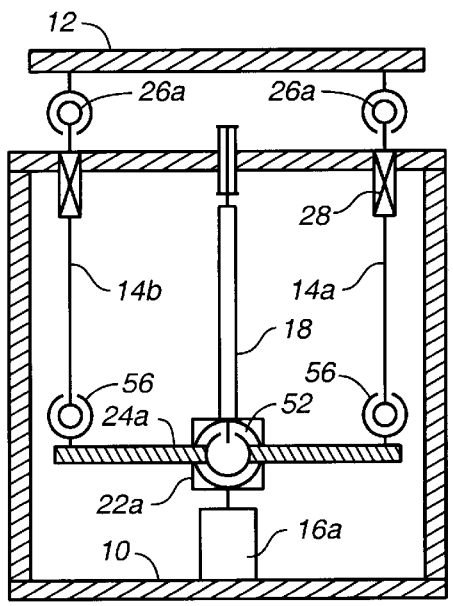
FIG._12
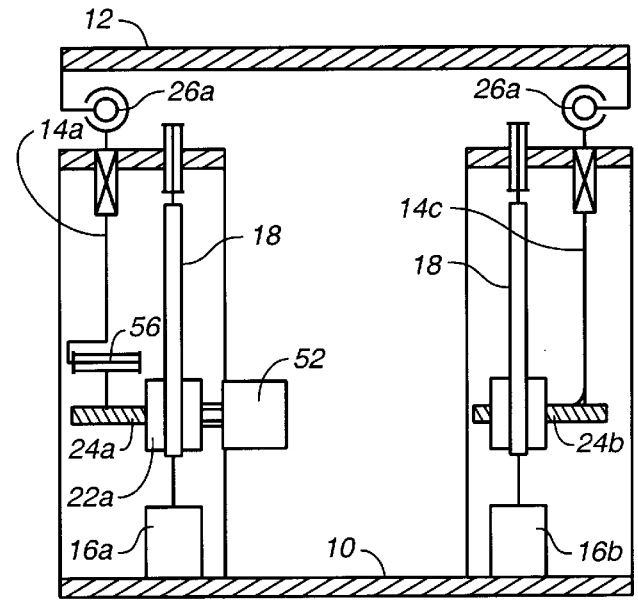
FIG._13
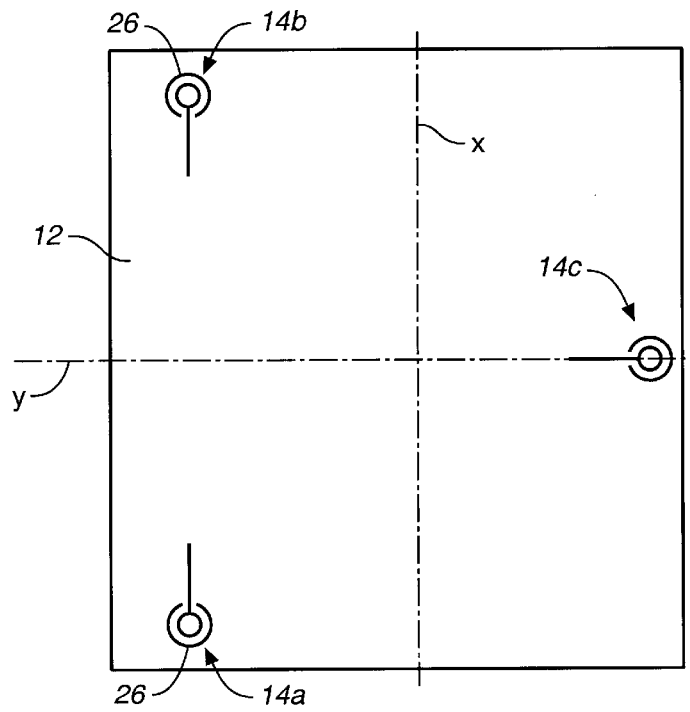
FIG._14

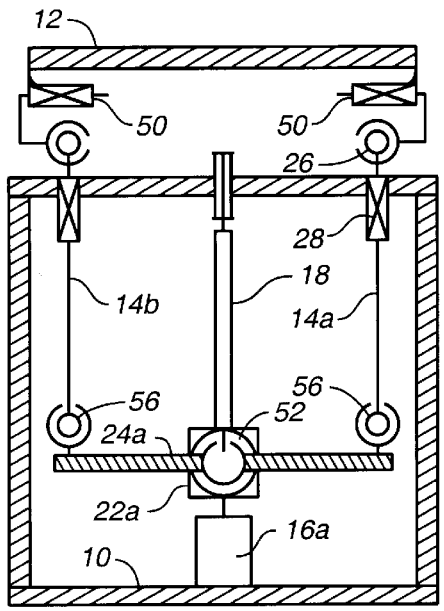
FIG._15
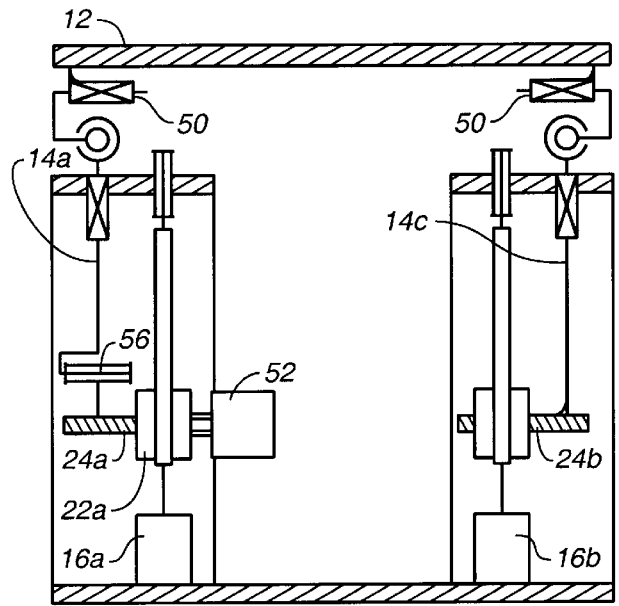
FIG._16
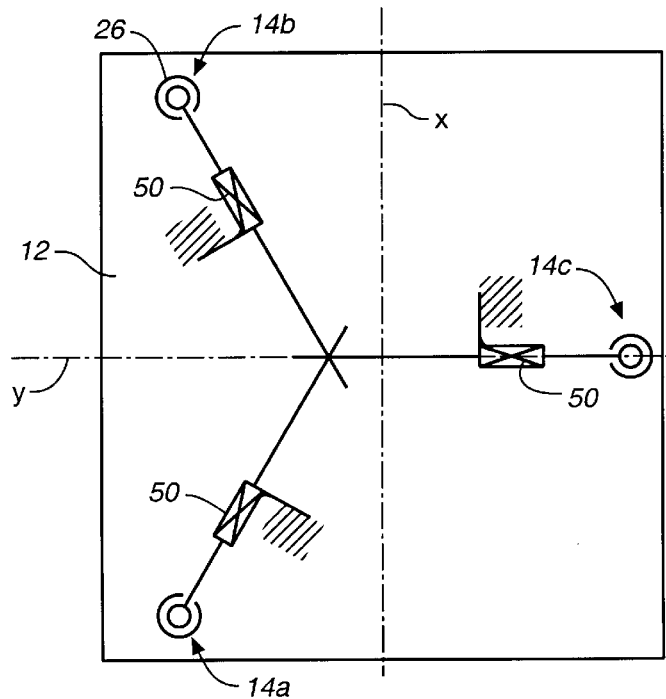
FIG._17

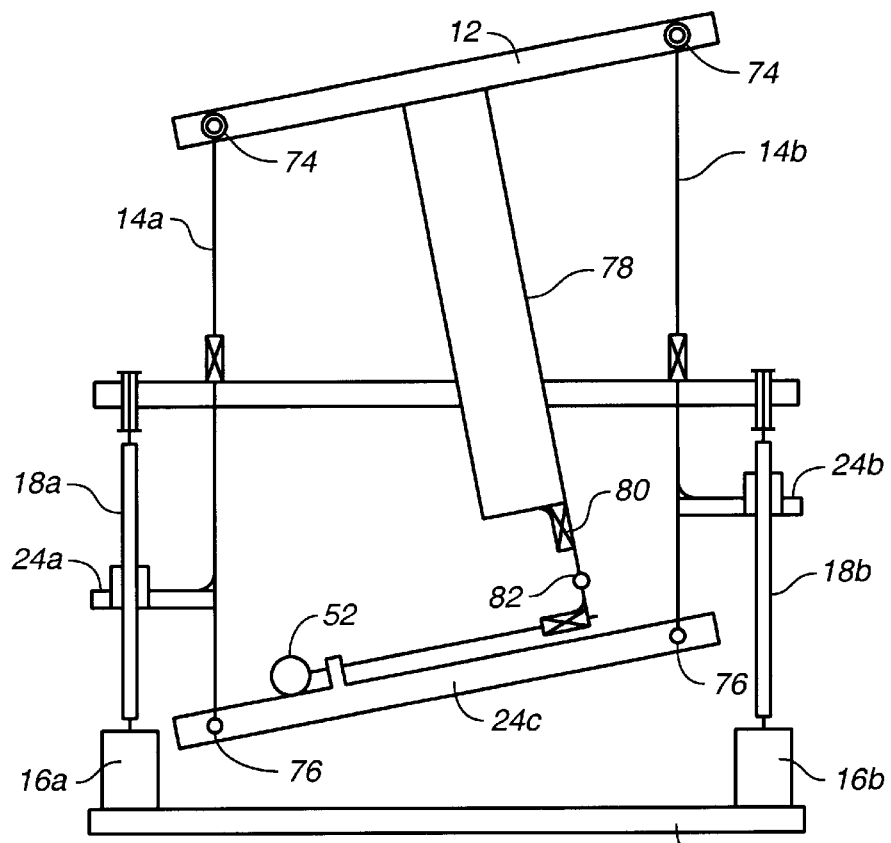
FIG._18
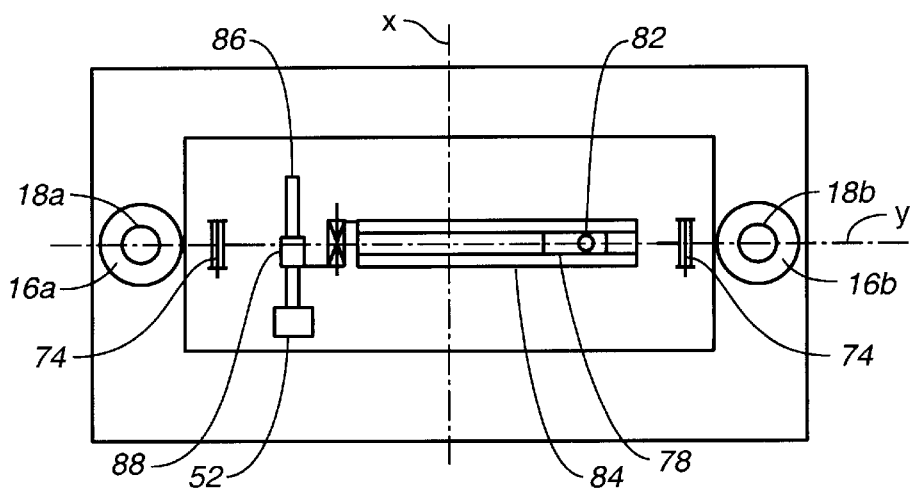
FIG._19

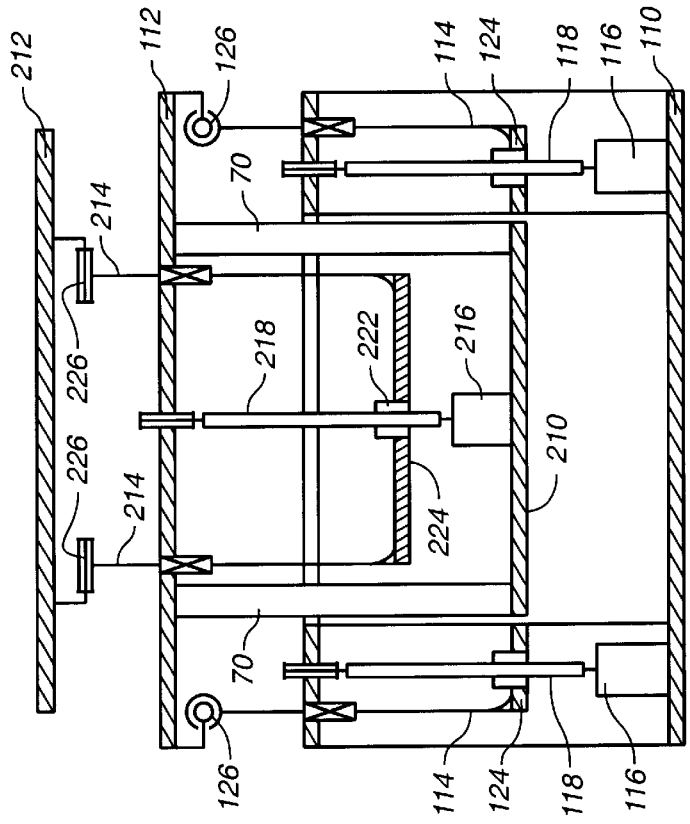
FIG._20
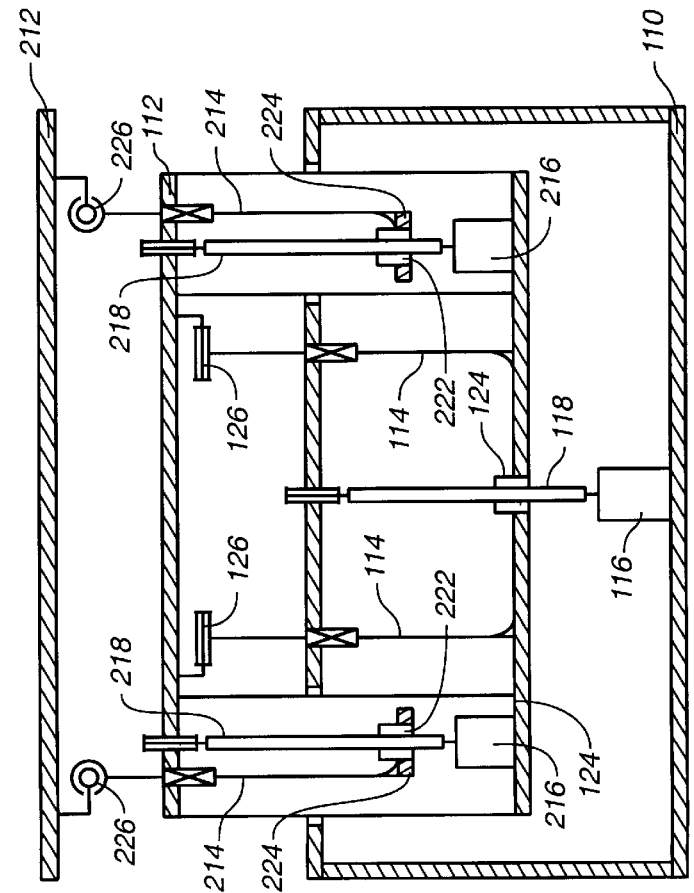
FIG._21

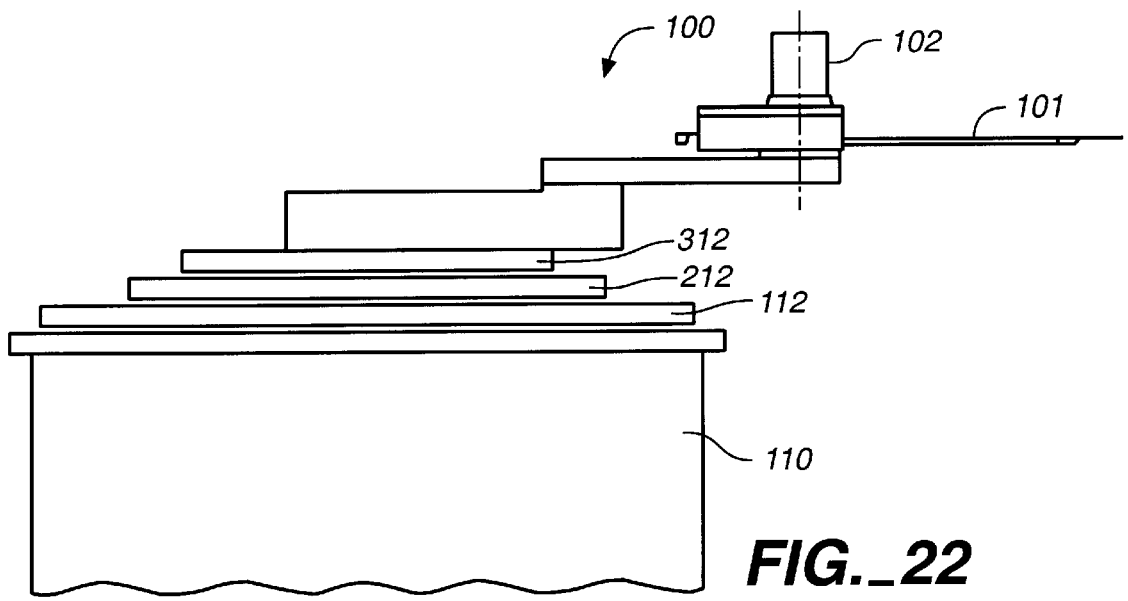
FIG._22
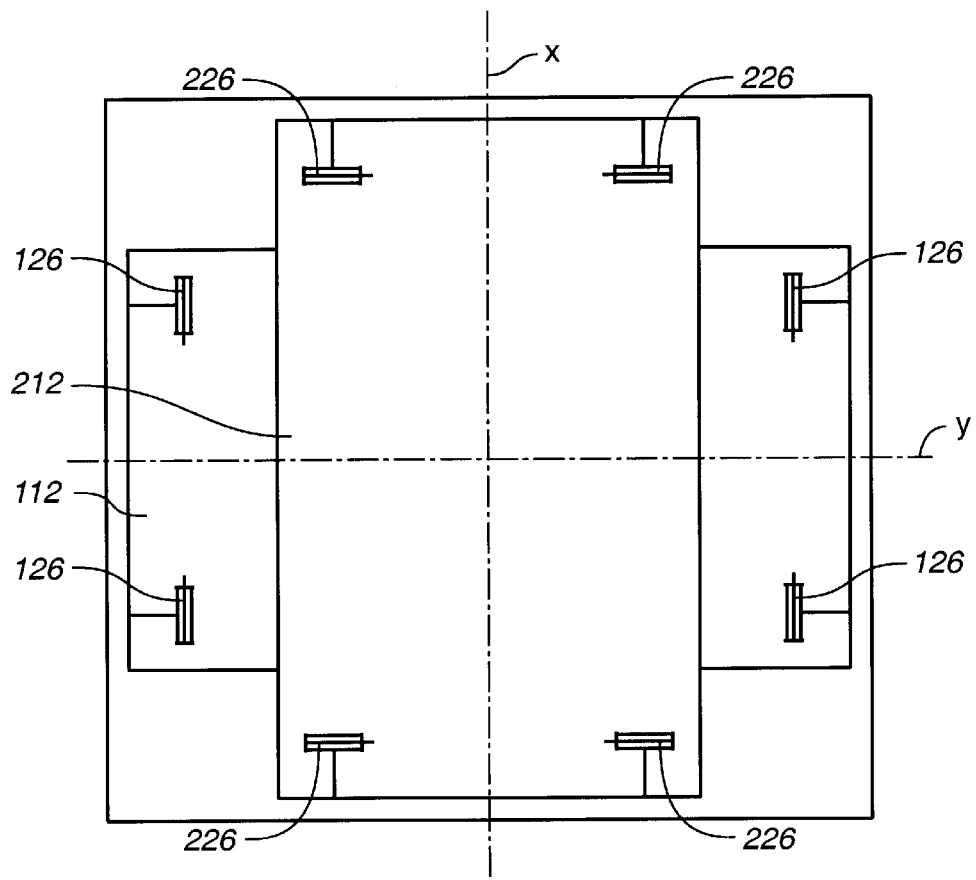
FIG._23

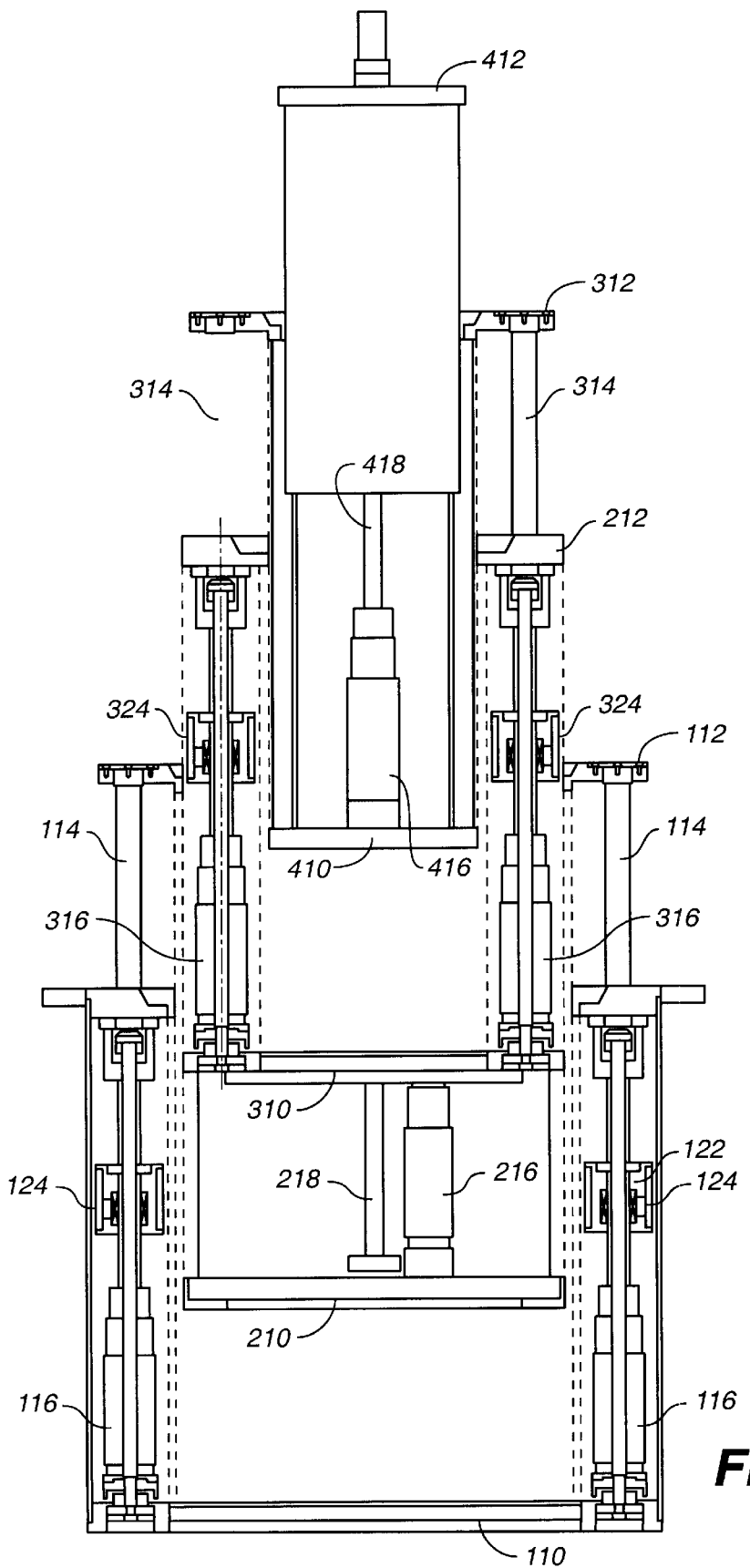
FIG._24

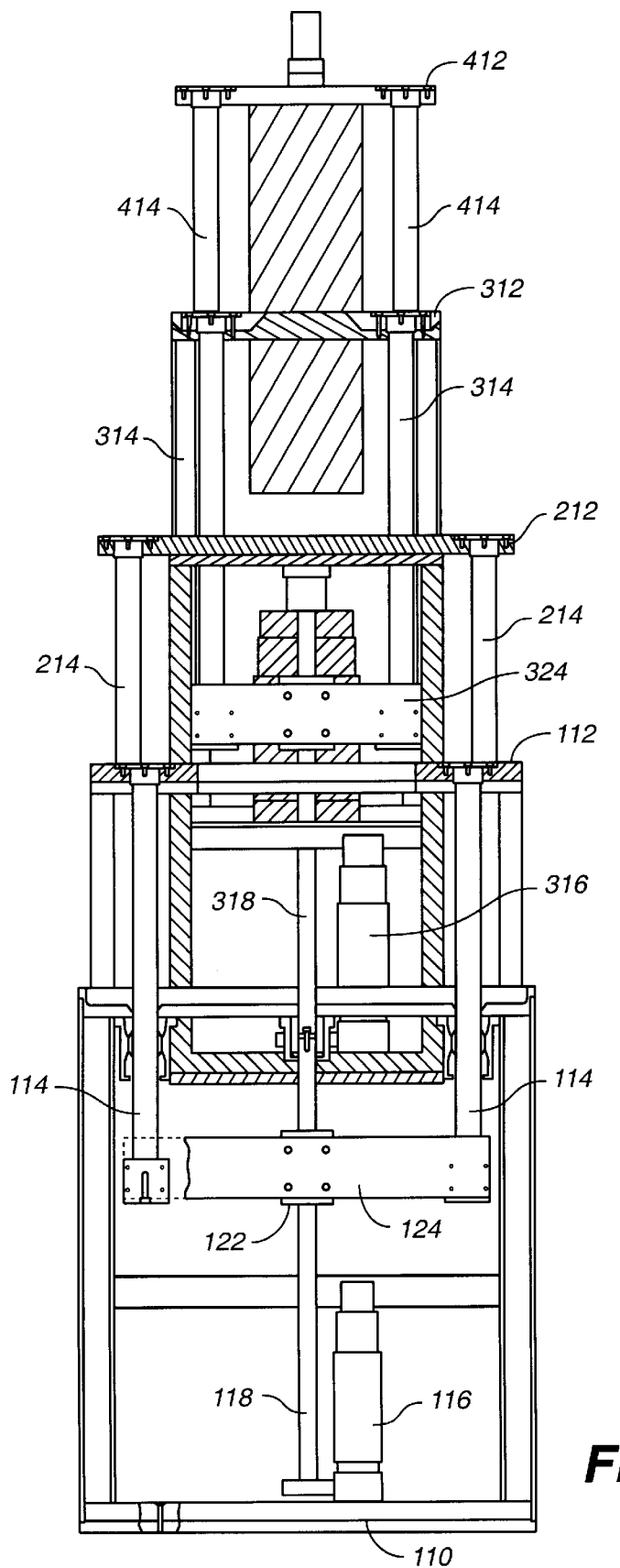
FIG._25

TILTABLE Z-AXIS PLATFORM BASED ON UNI-DIRECTIONAL TILT PLATFORM

BACKGROUND OF THE INVENTION

1. Field of the Invention

The invention relates to a tiltable Z-axis platform, and more particularly, the invention relates to a tiltable Z-axis platform for supporting and moving a robotic arm or other mechanism.

2. Brief Description of the Related Art

In the semiconductor wafer and flat panel display processing fields, robot arms are used in moving substrates including semiconductor wafers and flat panel displays to and from cassettes and workstations where the substrates are stored and various processing steps take place. The robot arm and the workstations or cassettes where the substrates are held must be aligned with one another so that the substrates can be transferred and positioned properly without damage.

Several different types of robot arm linkages are known in the art. These linkages include telescoping arms, rotatable link arms, and isosceles triangle-type linkages. Telescoping arms include multiple members slidable with respect to one another to allow linear extension of the arm.

More commonly used robot arms include two or more links which are pivotally connected to one another to form an arm in which the links are pivoted in a coordinated manner to extend and retract the arm. Pulleys, belts, and motors are generally utilized to move the links of the robot arm with respect to one another and to move a robot end effector or hand located at the end of the arm which is used to grasp and transport a substrate. In use, the robot arm is extended to a location of a substrate positioned in a cassette or at a workstation and picks up the substrate with the end effector generally by vacuum. The arm is then retracted and rotated to the position of another cassette or workstation. The robot arm carrying the substrate is then advanced to the cassette or workstation where the substrate is deposited.

In some situations it would be desirable to be able to tilt a robotic arm mechanism, as a whole about a Z-axis, so as to allow better alignment of the robot for a particular task. One situation in which a tiltable Z-axis robot would be desirable is during the unloading of substrates from a cassette. In typical semiconductor wafer cassettes, a plurality of semiconductor wafers are stacked one above the other and spaced apart from one another. The wafers are supported in the cassette by a narrow ledge at the periphery of the wafers in order to avoid or minimize contamination of the wafers. Occasionally, one of the wafers in the cassette is loaded in a misaligned configuration or slips off of a portion of the ledge during transport. In such a situation, a tiltable Z-axis platform allows the robot to be tilted to accommodate such a misalignment of a substrate.

Another problem occurring during manipulation of substrates, including semiconductor wafers and flat panels, is that the Z-axis of the robotic arm may not be completely parallel to the axis of a cassette or workstation at which the substrate is positioned. The relative tilt between the robot and the cassette or workstation may be only a few degrees. However, this misalignment prevents the robot arm from being able to properly approach and pick up the substrate with the end effector and properly place the substrate in a cassette or workstation.

Adjustment of the Z-axis of a robotic arm is also useful when transporting large substrates which may deflect the robot arm slightly downward due to the substrate weight. An adjustable Z-axis platform may be used to compensate for deflections of the robot arm under the weight of a substrate to align the substrate with a workstation or cassette.

Robot arms having universally tiltable Z-axes to accommodate misalignments are disclosed in U.S. patent applications Ser. No. 08/661,292, filed Jun. 13, 1996; Ser. No. 08/788,898, filed Jan. 23, 1997; and Ser. No. 08/889,907, filed Jul. 10, 1997, each of which is incorporated herein by reference in its entirety. The universally tiltable Z-axis robots described in the previously filed applications include one or more platforms which are tiltable in multiple directions. However, the mechanisms used for these universally tiltable Z-axis platforms are relatively complex and expensive.

Accordingly, it would be desirable to provide a universally tiltable Z-axis platform with a simpler and less costly construction. In addition, in some circumstances it may be desirable to provide a uni-directional tiltable platform for supporting a robotic arm mechanism or other mechanisms.

SUMMARY OF THE INVENTION

The present invention relates to a uni-directional tilt mechanism for tilting a platform supporting a robotic arm or other mechanism. Multiple uni-directional tilt platforms according to the present invention may be assembled by stacking the platforms to provide a universally tiltable stacked platform for supporting a robotic arm mechanism.

In accordance with one aspect of the present invention, a uni-directional tiltable platform includes a base, a support platform movable with respect to the base and having a support surface for supporting a robotic arm mechanism, and first and second linearly extending generally parallel members each having an upper end, a lower end, and a longitudinal axis. First and second rotational joints connect the upper ends of the first and second linearly extending members to the support platform. A first drive mechanism drives the first linearly extending members at a first speed in a direction parallel to the longitudinal axis of the first linearly extending member and a second drive mechanism drives the, second linearly extending member at a second speed in a direction parallel to the longitudinal axis of the second linearly extending member. The second speed is different than the first speed in order to tilt the support platform in one dimension with respect to the base.

In accordance with another aspect of the present invention, a uni-directional tiltable platform for supporting a robotic arm mechanism includes a base, a support platform movable with respect to the base and having a support surface for supporting a robotic arm mechanism, first and second linearly extending members supported on a movable first carriage, and third and fourth linearly extending members supported on a movable second carriage. A plurality of rotational joints connect an upper end of each of the linearly extending members to the support platform. A first drive mechanism moves the first carriage in a first direction, and a second drive mechanism moves the second carriage in a second direction which is substantially parallel to the first direction. When the first drive mechanism and the second drive mechanism drive the first and second carriages at different speeds the support platform is tilted with respect to the base.

The present invention provides advantages of a uni-directional tilt platform having a less complex structure. Two or more uni-directional tilt platforms may be stacked to form a platform system which is capable of multi-directional tilt. The stacked platforms have tilt axes which cross one another and may or may not be perpendicular to provide multi-directional tilt. The multi-directional tilt stacked platform system with two or more stacked platforms is used to allow alignment of a Z-axis of a substrate transported by a robot with cassettes or workstations in which the substrate is to be placed. The multi-directional platform may also be used to support structures other than robots.

BRIEF DESCRIPTION OF THE DRAWINGS

The invention will now be described in greater detail with reference to the preferred embodiments illustrated in the accompanying drawings, in which like elements bear like reference numerals, and wherein:

FIG. 1 is a schematic front view of a uni-directional tilt platform according to the present invention;

FIG. 2 is a schematic side view of the uni-directional tilt platform of FIG. 1;

FIG. 3 is a schematic front view of the uni-directional tilt platform illustrating the tilting of the platform;

FIG. 4 is a schematic front view of an alternative embodiment of the uni-directional tilt platform with flexible couplings;

FIG. 5 is a schematic front view of another alternative embodiment of the uni-directional tilt platform with a single motor and transmission system;

FIG. 6 is a schematic side view of the a uni-directional tilt platform with extended tilt capabilities;

FIG. 7 is a schematic front view of the uni-directional tilt platform with extended tilt capabilities of FIG. 6;

FIG. 8 is a schematic top view of the uni-directional tilt platform with extended tilt capabilities of FIG. 6;

FIG. 9 is a schematic front view of the uni-directional tilt platform with extended tilt capabilities of FIG. 6 illustrating the tilting of the platform;

FIG. 10 is a schematic side view of a bi-directional tilt platform according to an alternative embodiment of the invention;

FIG. 11 is a schematic front view of the bi-directional tilt platform of FIG. 10;

FIG. 12 is a schematic side view of an alternative embodiment of a bi-directional tilt platform having three vertical lift members;

FIG. 13 is a schematic front view of the bi-directional tilt platform of FIG. 12;

FIG. 14 is a schematic top view of the bi-directional tilt platform of FIG. 12;

FIG. 15 is a schematic side view of a bi-directional tilt platform having three vertical lifting members and extended tilt capabilities;

FIG. 16 is a schematic front view of the bi-directional tilt platform with extended tilt capabilities of FIG. 15;

FIG. 17 is a schematic top view of the bi-directional tilt platform with extended tilt capabilities of FIG. 15;

FIG. 18 is a schematic side view of a bi-directional tilt platform having two vertical lift members;

FIG. 19 is a schematic top view of the bi-directional tilt platform of FIG. 18;

FIG. 20 is a schematic side view of an assembly of two uni-directional tilt platforms according to the present invention;

FIG. 21 is a schematic front view of the assembly of two uni-directional tilt platforms of FIG. 20;

FIG. 22 is a side view of a robot arm mechanism attached to a multi-directional tilt platform system including three stacked platforms;

FIG. 23 is a schematic top view of the assembly of two uni-directional tilt platforms of FIG. 20;

FIG. 24 is a side view of a multi-directional tilt platform system including four stacked platforms; and FIG. 25 is a front view of the multi-directional tilt platform system including four stacked platforms of FIG. 24.

DETAILED DESCRIPTION OF THE PREFERRED EMBODIMENTS

The present invention relates to a uni-directional tilt platform for supporting a robot arm mechanism and providing one or more additional degrees of freedom to the robot arm mechanism. The uni-directional tilt platform of the present invention compared to the universally tiltable platform has a simpler design, but also has limited motion capabilities because it can tilt in only one direction. When two or more such platforms are stacked one above the other with the tilt axes of the stacked platforms staggered or non-parallel, the combined platform system is capable of multi-directional tilt motion. Accordingly, the combined platform system possesses all the kinematic capabilities of a universally tiltable platform with a simplified mechanical design.

While the present invention will be useful in a number of different applications, the invention has been particularly designed for use with a robotic arm mechanism of the nature used for positioning substrates including semiconductor wafers and flat panel displays during processing. Accordingly, the invention will be described in terms of substrates, substrate cassettes, workstations, end effectors, and the like. However, it should be understood that the invention will also be applicable to other applications in which mechanisms other than substrate transporting robotic arm mechanisms are mounted on the platforms of the present invention.

FIG. 1 illustrates a uni-directional tilt platform of the present invention including a base 10, an upper platform 12 supported by four vertically movable lift members 14, and two motors 16 for lifting and tilting the upper platform with respect to the base. The movable lift members 14 are arranged in a generally rectangular configuration beneath the upper platform 12. The two motors 16 each operate to move two of the four vertically movable lift members 14. The motors 16 can be operated simultaneously to raise and lower the upper platform 12 with respect to the base 10 or can be operated independently at different rates to tilt the upper platform with respect to the base.

The motors 16 each have a vertically oriented lead screw 18 connected to the drive shaft of the motor. Each of the lead screws 18 is provided with a lead screw bearing 20 at an upper end and a nut 22 positioned on each of the lead screws for longitudinal motion along the lead screw upon rotation of the lead screw. A carriage 24 is mounted on each of the nuts 22 for vertically translating the lift members. Each of the vertical lift members 14 has a lower end which is mounted on one of the carriages 24 and an upper end which is connected to the upper platform 12 by a rotational bearing 26. The vertical lift members 14 are provided with bearings 28 fixed at the base 10 which allow vertical motion of the lift members with respect to the base. The bearings 28 may be any type of supporting connection allowing longitudinal motion between the lift members 14 and the base 10, for example, the bearings 28 may be ball-spline bearings.

The uni-directional platform operates to provide the upper platform 12 with one degree of rotational freedom with respect to the base 10. The rotation is provided about an axis extending through the platform in a direction generally perpendicular to a line extending between the two motors 16 or a line extending between the two lead screws 18. In order to raise and lower the upper platform 12 without rotation, the two motors 16 are operated at the same speed or synchronously. When only one of the motors 16 is operated or when the motors are operated at different speeds, the upper platform 12 tilts about the rotational axis. As the platform 12 tilts, the rotational bearings 26 connecting the lift members 14 to the platform allow the platform to rotate with respect to the lift members. The rotational axes of the rotational bearings 26 is substantially parallel to the rotational axis of the platform. The rotational bearings 26 may be ball and socket joints or any other type of hinge element which is known in the art.

The motors 16 of the various embodiments of the present invention may be mounted as shown in the figures directly below the rotatable lead screws 18 with the motor drive shafts connected directly to the lead screws. Alternatively, the motors 16 may be mounted above the lead screws 18 on an upper portion 11 of the base 10. The top mounted motors would operate in the same manner as the bottom mounted motors. According to another variation, the motors 16 may be positioned at another location such as beside the lead screws 18 and belt or gear system may be used to transmit rotation of the motor drive shaft to the lead screw.

The uni-directional tilt platform is illustrated in a tilted position in FIG. 3 in which one of the motors 16 has been operated to move the two lift members 14 on the right side of the figure higher than the two lift members on the left side of the figure. However, the amount of tilt which can be achieved by the uni-directional tilt platform according to FIGS. 1–3 is limited by the constrained condition of the system in the tilted position. In particular, the tilt is limited because the lift members 14 remain substantially vertical and at a substantially constant spacing while the upper platform 12 is tilted resulting in the constrained condition. The amount of tilt is mainly limited by the tolerance of the rotational bearings 26 which will vary depending on the type of bearings used. The constrained condition results in the ability to tilt the upper platform 12 up to about 5 degrees depending on the amount of play provided in the system.

FIG. 4 illustrates an alternative embodiment of the uni-directional tilt platform in which the rotational bearings 26 connecting the lift members 14 to the upper platform 12 are flexible couplings 30. The flexible couplings 30 include an elastic element having a lower end fixed to the lift members 14 and an upper end fixed to the lower surface of the platform 12. The elastic element of the flexible coupling 30 may be formed of plastic, rubber, or other flexible material or may be in the form of a spring.

FIG. 5 is a front view of an alternative embodiment of the uni-directional tilt platform according to the present invention in which the two motor actuator system of the embodiments of FIGS. 1–4 is replaced with a single motor 36. The single motor 36 is positioned beneath and actuates a first of the lead screws 18a. A transmission system 38 is provided for actuation of the second lead screw 18b from the single motor 36. The transmission system 38 includes an input gear 40, a plurality of output gears 42, and a timing belt 44. A clutch (not shown) allows switching between one or more of the output gears 42 to achieve the same or different speeds of rotation of the two lead screws 18a, 18b.

Alternatively, the embodiment of FIG. 5 may be operated with a single output gear 42 and without a clutch in a system in which the motor 36 rotates both of the lead screws 18 at the same speed. Although the tilt capability will be lost by the elimination of the independently drivable lead screws 18a, 18b, the platform will be able to move the robot arm mechanism vertically with increased stability and safety.

FIGS. 6–9 illustrate a uni-directional tilt platform according to the present invention with extended tilt capabilities. In the platform of FIG. 6, the constrained condition occurring when the platform of FIGS. 1–3 is tilted is eliminated by the addition of two tracks 50 or platform splines. The tracks 50 allow relative longitudinal motion between the upper platform 12 and two of the rotational bearings 26. The two rotational bearings 26 which are provided with the tracks 50 are located at two of the lift members 14 which are arranged for simultaneous movement on the same carriage 24.

As shown in FIG. 9, as the upper platform 12 is tilted by lifting of one of the carriages 24, the platform rotates on the rotational bearings 26 and longitudinal motion between the platform and the lift members 14 on one side of the platform is permitted by the tracks 50. According to a preferred embodiment of the extended tilt platform of FIGS. 6–9, the tracks 50 are used on only one side of the upper platform. The tracks 50 provide the ability to tilt the upper platform 12 at least about 20 degrees, preferably at least about 60 degrees, depending on the lengths of the tracks and positioning of the tracks on the platform.

An alternative embodiment of the present invention, as shown in FIGS. 10 and 11, provides a platform supported by four lift members 14 which provides bi-directional tilt. The second degree of rotational freedom according to this embodiment is provided by a third motor 52 which rotates the upper platform 12 about a second axis of rotation which is non-parallel or substantially perpendicular to the axis of rotation of the platform described above with respect to FIGS. 1–3. The third motor 52 is fixed to one of the nuts 22a which travels along the lead screw 18a. The drive shaft 54 of the motor 52 is attached to the carriage 24a to rotate the carriage with respect to the nut 22a. Alternatively, the motor 52 may be fixed to the carriage 24a and the drive shaft 54 may be connected to the nut 22a.

The nut 22b on an opposite side of the platform 12 is connected to the carriage 24b by a rotational bearing 56 to allow both of the carriages 24a, 24b to rotate together when the third motor 52 is operated in forward or reverse to tilt the platform. Each of the lift members 14 is secured to a corresponding carriage 24a, 24b at a lower end by a lower rotational bearing 58 which allows rotational motion between the lift members and the carriage as the carriage is rotated. Each of the lift members 14 is also connected at an upper end to the platform 12 by joint 26a which is a spherical, universal, rotational, or flexible joint.

FIGS. 12–14 illustrate an alternative embodiment of the bi-directional tilt platform in which three lift members 14a, 14b, 14c and three motors 16a, 16b, 52 are provided. The first and second motors 16a, 16b rotate the lead screws 18 to lift the upper platform 12 vertically and/or rotate the platform about a first axis of rotation X which is perpendicular to a line connecting the first and second lead screws 18. The third motor 52 rotates the platform 12 about a second axis of rotation Y which is substantially perpendicular to the first axis of rotation X. The second axis of rotation Y need not be perpendicular to the first axis of rotation X to provide bi-directional tilt. The third motor 52 is connected between a nut 22a and carriage 24a at one side of the platform, as in the embodiment of FIGS. 10–11. The lower ends of the first and second lift members 14a, 14b are mounted to the carriage 24a by rotational bearings 56. An opposite side of the platform 12 from the third motor 52 is supported by a single lift member 14c which is generally aligned with the third motor 52 to allow rotation of the platform about the second axis. The upper ends of the first, second, and third lift members 14a, 14b, 14c are connected to the platform by flexible or rotatable joints 26a. The lower end of the third lift member 14c is fixed to the carriage 24b without a rotatable coupling.

FIGS. 15–17 illustrate an alternative embodiment of the bi-directional tilt platform including three lift members 14a, 14b, 14c and three motors 16a, 16b, 52. The first two motors 16a, 16b provide rotation about the rotational axis X and the third motor 52 provides rotation about the rotational axis Y. In the FIGS. 15–17 embodiment three tracks 50 or platform splines are positioned between the lift members 14a, 14b, 14c and the upper platform 12 to provide extended tilt capabilities along both the first rotational axis X and the second rotational axis Y of the platform.

FIGS. 18 and 19 illustrate an alternative embodiment of a bi-directional tilt platform having two lead screws 18a and 18b and two lift members 14a, 14b, as well as three motors 16a, 16b, 52 for bi-directional tilt. The platform 12 is connected by spherical joints 74 or other joints providing two degrees of freedom to the two vertical lift members 14a, 14b. The lower ends of the lift members 14a, 14b are secured to the two side carriages 24a, 24b and are secured to a central carriage 24c by rotational joints 76. Rotation of the motors 16a, 16b rotates the platform in one dimension about the X axis shown in FIG. 19.

A vertically extending member 78 is fixed to and depends from the upper platform 12. The vertically extending member 78 can be any transmission member such as a rod, bracket, plate, or the like. A lower end of the vertically extending member 78 is connected by a prismatic joint 80 and a spherical joint 82 to a slide 84. The third motor 52, shown in the top view of FIG. 19, is attached to the central carriage 24c. Rotation of the motor 52 translates the entire slide 84 in a direction parallel to the X axis by a system of a lead screw 86 and nut 88.

In operation, the motors 16a, 16b operate to rotate the platform 12 about the X axis, while the motor 52 rotates the platform about the Y axis. Rotation of the motor 52 translates the slide 84 causing the lower end of this vertically extending member 78 to be displaced which rotates the platform 12 on the spherical joints 74.

FIGS. 20, 21, and 23 are side, front, and top views, respectively, of an assembly of two stacked uni-directional tilt platforms according to the present invention. The two stacked uni-directional tilt platforms together provide a multi-directional tilting support for a robotic arm mechanism or other structure. The stacked platform assembly according to this embodiment will be described below with reference numerals having a prefix 1 for the first or lower platform and associated members, and a prefix 2 for the second or upper platform and associated members.

The first or lower platform of the stacked platform assembly includes a base 110, an upper platform 112, and four vertically movable lift members 114. Two motors 116 are provided for lifting and tilting the platform 112 with respect to the base 110. The motors 116 can be operated simultaneously to raise and lower the platform 112 with respect to the base 110 or can be operated independently at different rates to tilt the platform with respect to the base. The motors 116 each have a vertically oriented lead screw 118 which translates a nut 122 positioned on each of the lead screws for longitudinal motion along the lead screw. A carriage 124 is mounted on each of the nuts 122 for vertically translating the lift members 114. In addition, rotational bearings 126 are mounted between the lift members 114 and the platform 112 to allow relative rotation between the lift members and the platform. As shown in FIG. 23, the first or lower platform 112 is rotatable about a first rotational axis X.

The second or upper uni-directional tilt platform includes a base 210 which is fixed to the platform 112 of the first uni-directional tilt platform by vertical columns 70. The upper uni-directional tilt platform also includes a robot support platform 212, four vertically movable lift members 214, and two motors 216 for lifting and tilting the upper platform 212 with respect to the base 210. The two motors 216 each operate to move two of the four vertically movable lift members 214 by raising and lowering the two carriages 224 on which the lift members are mounted. The motors 216 can be operated simultaneously to raise and lower the upper platform 212 upon which the robotic arm mechanism is mounted. Alternatively, the two motors 216 can be operated independently at different rates to tilt the upper platform 212 with respect to the base 210. Similar to the lower uni-directional tilt platform, the upper uni-directional tilt platform also includes lead screws 218 having nuts 222 movable along the lead screws, and rotational bearings 226 at the tops of the lift members 214. The upper uni-directional platform 212 is rotatable about the second rotational axis Y shown in FIG. 23 and is also rotatable about the first rotational axis X by motion of the lower platform 112.

FIG. 22 illustrates a robot arm mechanism 100 having an end effector 101 with associated motor 102. The arm mechanism 100 is mounted on a multi-directional tilt platform system according to the present invention. The multi-directional tilt platform system includes three of the uni-directional tilt platforms described above. In particular, an upper platform 112, 212, 312 of each of the three platform systems is shown in FIG. 22.

FIGS. 24 and 25 show side and front views of a multi-directional tilt platform system including four stacked platforms. This multi-directional tilt platform system operates in the manner described above with respect to FIGS. 20, 21, and 23. Reference numerals for the four stacked platforms of FIG. 22 are preceded by a prefix 1–4 for the platform number described. As indicated in the figures, the motors are not always positioned directly beneath the lead screws but may positioned at the side of the lead screws with a gearing or belt system provided to rotate the lead screws.

Although the present invention has been described with respect to rectangular platforms in which successive stacked platforms are oriented with their axis of rotation positioned approximately at ninety degrees to each other, it should be understood that other arrangements of the platforms are within the invention. In addition, the platforms may employ two, three, four, or more lift members 14 with larger numbers of lift members providing greater stability.

Further, the various aspects of the present invention described above may be used either independently or in combination. For example, any of the embodiments described above may incorporate the extended travel feature, the single motor and transmission system, the third motor for an additional degree of rotational freedom, or any of the other features which have been described.

While the invention has been described in detail with reference to the preferred embodiments thereof, it will be apparent to one skilled in the art that various changes and modifications can be made and equivalents employed, without departing from the present invention.

What is claimed is:

1. A uni-directional, kinematically restrained tiltable platform comprising:
   a base;
   a support platform movable with respect to the base and having a support surface for supporting a robotic arm mechanism;
   first and second linearly extending members each having an upper end, a lower end, and a longitudinal axis, the first and second linearly extending members being substantially parallel to each other;
   first and second rotational joints connecting the upper ends of the first and second linearly extending members to the support platform, said first and second rotational joints being mounted so as to be substantially fixed in position relative to the support platform;
   a first drive mechanism for driving the first linearly extending member at a first speed in a direction parallel to the longitudinal axis of the first linearly extending member; and
   a second drive mechanism for driving the second linearly extending member at a second speed in a direction parallel to the longitudinal axis of the second linearly extending member.

2. The uni-directional tiltable platform according to claim 1, wherein the first drive mechanism includes a first motor having a first drive shaft, and the first linearly extending member is connected to a first support member which is movable in a direction parallel to the longitudinal axis of the first linearly extending member in response to rotation of the drive shaft.

3. The uni-directional tiltable platform according to claim 2, wherein the second drive mechanism includes a second motor having a second drive shaft, and the second linearly extending member is connected to a second support member which is movable in a direction parallel to the longitudinal axis of the second linearly extending member in response to rotation of the second drive shaft.

4. The uni-directional tiltable platform according to claim 2, wherein the second drive mechanism includes a second drive shaft connected to the first drive shaft of the first motor by a gearing system allowing the second drive shaft to be rotated at a speed different from a speed of the first drive shaft, and the second linearly extending member is connected to a second support member which is movable in a direction parallel to the longitudinal axis of the second linearly extending member in response to rotation of the second drive shaft.

5. The uni-directional tiltable platform according to claim 1, wherein the first drive mechanism includes a first lead screw connected to an output shaft of a first motor and a first support member arranged for longitudinal movement along the first lead screw upon rotation of the first lead screw.

6. The uni-directional tiltable platform according to claim 5, wherein the second drive mechanism includes a second lead screw connected to an output shaft of a second motor and a second support member arranged for longitudinal movement along the second lead screw upon rotation of the second lead screw.

7. The uni-directional tiltable platform according to claim 1, wherein the first and second rotational joints are ball and socket joints.

8. The uni-directional tiltable platform according to claim 1, wherein the first and second drive mechanisms comprise first and second motors which move the first and second linearly extending members longitudinally to rotate the support platform about an axis of rotation.

9. The uni-directional, kinematically restrained tiltable platform according to claim 1, wherein the first and second rotational joints have a preselected amount of play and allow the support platform to tilt while maintaining the substantially parallel relationship of the first and second linearly extending members.

10. The uni-directional, kinematically restrained tiltable platform according to claim 1, wherein the first and second speeds are substantially similar to provide vertical motion for the support platform with respect to the base.

11. The uni-directional, kinematically restrained tiltable platform according to claim 1, wherein the second speed is different than the first speed to provide uni-directional tilt motion for the support platform with respect to the base.

12. The uni-directional, kinematically restrained tiltable platform according to claim 1, further comprising:
    third and fourth drive mechanisms; and
    a second uni-directional tiltable platform supporting the support platform, the second uni-directional tiltable platform having a second platform coupled with a third and a fourth linearly extending members, wherein the third and fourth drive mechanisms move the third and fourth linearly extending members longitudinally to rotate said second platform about an axis of rotation.

13. The uni-directional, kinematically restrained tiltable platform according to claim 12, wherein the second platform is rotatable in a direction which differs from a direction of rotation of said support platform.

14. The uni-directional, kinematically restrained tiltable platform according to claim 12, further comprising:
    fifth and sixth drive mechanisms; and
    a third uni-directional tiltable platform supporting the second platform, the third uni-directional tiltable platform having a third platform coupled with a fifth and a sixth linearly extending members, wherein the fifth and sixth drive mechanisms move the fifth and sixth linearly extending members longitudinally to rotate said third platform about an axis of rotation.

15. The uni-directional, kinematically restrained tiltable platform according to claim 14, wherein at least one of the second and third platforms of the second and third uni-directional tiltable platforms is rotatable in a direction which differs from a direction of rotation of said support platform.

16. The uni-directional, kinematically restrained tiltable platform according to claim 1, further comprising a plurality of uni-directional tiltable platforms supporting the support platform, wherein at least one of the plurality of uni-directional tiltable platforms has a support platform with a direction of rotation which differs from a direction of rotation of the support platform.

17. A uni-directional tiltable platform comprising:
    a base;
    a support platform movable with respect to the base and having a support surface;
    first and second linearly extending generally parallel members each having an upper end, a lower end, and a longitudinal axis;
    first and second rotational joints connecting the upper ends of the first and second linearly extending members to the support platform;
    a first drive mechanism for driving the first linearly extending member at a first speed in a direction parallel to the longitudinal axis of the first linearly extending member;
    a second drive mechanism for driving the second linearly extending member at a second speed in a direction parallel to the longitudinal axis of the second linearly extending member, wherein the second speed is different than the first speed to tilt the support platform in one dimension with respect to the base; and a second uni-directional tiltable platform mounted on the support platform, the second uni-directional platform having a second platform for supporting a robotic arm mechanism, the second platform with a direction of rotation which is substantially perpendicular to a direction of rotation of the support platform.

18. The uni-directional tiltable platform according to claim 17, wherein the first drive mechanism includes a first motor having a first drive shaft, and the first linearly extending member is connected to a first support member which is movable in a direction parallel to the longitudinal axis of the first linearly extending member in response to rotation of the drive shaft.

19. The uni-directional tiltable platform according to claim 18, wherein the second drive mechanism includes a second motor having a second drive shaft, and the second linearly extending member is connected to a second support member which is movable in a direction parallel to the longitudinal axis of the second linearly extending member in response to rotation of the second drive shaft.

20. The uni-directional tiltable platform according to claim 18, wherein the second drive mechanism includes a second drive shaft connected to the first drive shaft of the first motor by a gearing system allowing the second drive shaft to be rotated at a speed different from a speed of the first drive shaft, and the second linearly extending member is connected to a second support member which is movable in a direction parallel to the longitudinal axis of the second linearly extending member in response to rotation of the second drive shaft.

21. The uni-directional tiltable platform according to claim 17, wherein the first drive mechanism includes a first lead screw connected to an output shaft of a first motor and a first support member arranged for longitudinal movement along the first lead screw upon rotation of the first lead screw.

22. The uni-directional tiltable platform according to claim 21, wherein the second drive mechanism includes a second lead screw connected to an output shaft of a second motor and a second support member arranged for longitudinal movement along the second lead screw upon rotation of the second lead screw.

23. The uni-directional tiltable platform according to claim 17, further comprising:

third and fourth drive mechanisms; and a third uni-directional tiltable platform supporting the second platform, the third uni-directional tiltable platform having a third platform coupled with a third and a fourth linearly extending members, wherein the third and fourth drive mechanisms move the third and fourth linearly extending members longitudinally to rotate said third platform about an axis of rotation.

24. The uni-directional, kinematically restrained tiltable platform according to claim 23, wherein at least one of the second and third platforms of the second and third uni-directional tiltable platforms is rotatable in a direction which differs from a direction of rotation of said support platform.

25. The uni-directional, kinematically restrained tiltable platform according to claim 17, further comprising a plurality of uni-directional tiltable platforms supporting the second platform, wherein at least one of the plurality of uni-directional tiltable platforms has a support platform with a direction of rotation which differs from a direction of rotation of the second platform.

26. The uni-directional tiltable platform according to claim 17, wherein the first and second rotational joints are ball and socket joints.

27. A uni-directional tiltable platform for supporting a robotic arm mechanism or additional platforms, the platform comprising:

a base;

a support platform movable with respect to the base and having a support surface for supporting a robotic arm mechanism;

first and second linearly extending members supported on a movable first carriage;

third and fourth linearly extending members supported on a movable second carriage;

a plurality of rotational joints connecting an upper end of each of the linearly extending members to the support platform;

a first drive mechanism for moving the first carriage in a first direction; and a second drive mechanism for moving the second carriage in a second direction which is substantially parallel to the first direction, wherein when the first drive mechanism and the second drive mechanism drive the first and second carriages at different speeds the support platform is tilted with respect to the base.

28. The uni-directional tiltable platform according to claim 27, wherein the first drive mechanism includes a first motor and a first rotatable lead screw, the first lead screw supporting the first carriage and causing the first carriage to move in a direction substantially parallel to the first lead screw upon rotation of the first lead screw by the first motor.

29. The uni-directional tiltable platform according to claim 28, wherein the second drive mechanism includes a second motor and a second rotatable lead screw, the second lead screw supporting the second carriage and causing the second carriage to move in a direction substantially parallel to the second lead screw upon rotation of the second lead screw by the second motor.

30. The uni-directional platform according to claim 27, wherein the plurality of rotational joints are selected from a group consisting of flexible couplings, springs, ball and socket joints, and hinges.

31. The uni-directional platform according to claim 27, wherein each of the linearly extending members is movable in a direction parallel to a longitudinal axis of the linearly extending member and is substantially immovable in directions other then parallel to the longitudinal axis.

32. The uni-directional, kinematically restrained tiltable platform according to claim 27, further comprising:

third and fourth drive mechanisms; and a second uni-directional tiltable platform supporting the support platform, the second uni-directional tiltable platform having a second platform coupled with a third and a fourth linearly extending members, wherein the third and fourth drive mechanisms move the third and fourth linearly extending members longitudinally to rotate said second platform about an axis of rotation.

33. The uni-directional, kinematically restrained tiltable platform according to claim 32, wherein the second platform is rotatable in a direction which differs from a direction of rotation of said support platform.

34. The uni-directional, kinematically restrained tiltable platform according to claim 32, further comprising:

fifth and sixth drive mechanisms; and a third uni-directional tiltable platform supporting the second platform, the third uni-directional tiltable platform having a third platform coupled with a fifth and sixth linearly extending members, wherein the fifth and sixth drive mechanisms move the fifth and sixth linearly extending members longitudinally to rotate said third platform about an axis of rotation.

35. The uni-directional, kinematically restrained tiltable platform according to claim 34, wherein at least one of the second and third platforms of the second and third uni-directional tiltable platforms is rotatable in a direction which differs from a direction of rotation of said support platform.

36. The uni-directional, kinematically restrained tiltable platform according to claim 27, further comprising a plurality of uni-directional tiltable platforms supporting the support platform, wherein at least one of the plurality of uni-directional tiltable platforms having a platform with a direction of rotation which differs from a direction of rotation of the support platform.

37. A robot for transporting substrates to and from cassettes and workstations in a semiconductor processing environment, the robot comprising:
 a base;
 a robotic arm mechanism adapted to transport the substrates in the semiconductor processing environment;
 a support platform movable with respect to the base and having a support surface for supporting the robotic arm mechanism;
 first and second linearly extending members each having an upper end, a lower end, and a longitudinal axis, the first and second linearly extending members being substantially parallel to each other;
 first and second rotational joints connecting the upper ends of the first and second linearly extending members to the support platform, said rotational joints being mounted so as to be substantially fixed in position relative to the support platform;
 a first drive mechanism for driving the first linearly extending member at a first speed in a direction parallel to the longitudinal axis of the first linearly extending member; and
 a second drive mechanism for driving the second linearly extending member at a second speed in a direction parallel to the longitudinal axis of the second linearly extending member.

38. The robot according to claim 37, wherein the first and second speeds are substantially similar to provide vertical motion for the robotic arm mechanism with respect to the base.

39. The robot according to claim 37, wherein the second speed is different than the first speed to provide uni-directional tilt motion for the robotic arm mechanism with respect to the base.

40. The robot according to claim 37, wherein the first drive mechanism includes a first motor having a first drive shaft, and the first linearly extending member is connected to a first support member which is movable in a direction parallel to the longitudinal axis of the first linearly extending member in response to rotation of the first drive shaft.

41. The robot according to claim 37, wherein the first drive mechanism includes a first lead screw connected to an output shaft of a first motor and a first support member arranged for longitudinal movement along the first lead screw upon rotation of the first lead screw.

42. The robot according to claim 37, wherein the first and second rotational joints are ball and socket joints.

43. The robot according to claim 37, wherein the first and second drive mechanisms comprise first and second motors which move the first and second linearly extending members longitudinally to rotate the support platform about an axis of rotation.

44. A uni-directional tiltable platform comprising:
 a base;
 a support platform movable with respect to the base and having a support surface;
 first and second linearly extending members each having an upper end, a lower end, and a longitudinal axis, the first and second linearly extending members being substantially parallel to each other;
 first and second rotational joints connecting the upper ends of the first and second linearly extending members to the first support platform;
 a first drive mechanism for driving the first linearly extending member at a first speed in a direction parallel to the longitudinal axis of the first linearly extending member;
 a second drive mechanism for driving the second linearly extending member at a second speed in a direction parallel to the longitudinal axis of the second linearly extending member, wherein the second speed is different than the first speed to tilt the support platform in one dimension with respect to the base; and
 a second uni-directional tiltable platform mounted on the support platform, the second uni-directional platform having a second platform for supporting a robotic mechanism, the second platform rotatable in a direction which differs from a direction of rotation of the support platform.

45. The uni-directional tiltable platform according to claim 44, wherein the first drive mechanism includes a first motor having a first drive shaft, and the first linearly extending member is connected to a first support member which is movable in a direction parallel to the longitudinal axis of the first linearly extending member in response to rotation of the drive shaft.

46. The uni-directional tiltable platform according to claim 45, wherein the second drive mechanism includes a second motor having a second drive shaft, and the second linearly extending member is connected to a second support member which is movable in a direction parallel to the longitudinal axis of the second linearly extending member in response to rotation of the second drive shaft.

47. The uni-directional tiltable platform according to claim 45, wherein the second drive mechanism includes a second drive shaft connected to the first drive shaft of the first motor by a gearing system allowing the second drive shaft to be rotated at a speed different from a speed of the first drive shaft, and the second linearly extending member is connected to a second support member which is movable in a direction parallel to the longitudinal axis of the second linearly extending member in response to rotation of the second drive shaft.

48. The uni-directional tiltable platform according to claim 44, wherein the first drive mechanism includes a first lead screw connected to an output shaft of a first motor and a first support member arranged for longitudinal movement along the first lead screw upon rotation of the first lead screw.

49. The uni-directional tiltable platform according to claim 48, wherein the second drive mechanism includes a second lead screw connected to an output shaft of a second motor and a second support member arranged for longitudinal movement along the second lead screw upon rotation of the second lead screw.

50. The uni-directional tiltable platform according to claim 44, wherein the first and second drive mechanisms comprise first and second motors which move the first and second linearly extending members longitudinally to rotate the support platform about an axis of rotation.

51. The uni-directional tiltable platform according to claim 44, wherein the first and second rotational joints are ball and socket joints.

* * * * *